United States Patent
Cheng et al.

(10) Patent No.: US 7,695,079 B2
(45) Date of Patent: Apr. 13, 2010

(54) FOLDABLE HOST UNIT CASE FOR A COMPUTER WITH DUAL CROSSOVER PIVOTAL MECHANISMS

(75) Inventors: Sheng-Hsiung Cheng, Taipei Hsien (TW); Te-An Lin, Taipei Hsien (TW); Wu-Nan Wang, Taipei Hsien (TW); Chia-Chia Huang, Taipei Hsien (TW)

(73) Assignee: Aopen Inc., Hsichi, Taipei Hsien (TW)

( * ) Notice: Subject to any disclaimer, the term of this patent is extended or adjusted under 35 U.S.C. 154(b) by 274 days.

(21) Appl. No.: 11/730,029

(22) Filed: Mar. 29, 2007

(65) Prior Publication Data

US 2007/0262681 A1 Nov. 15, 2007

(30) Foreign Application Priority Data

Apr. 26, 2006 (TW) ............................... 95114990 A

(51) Int. Cl.
*A47B 81/00* (2006.01)
(52) U.S. Cl. .................................................. 312/223.2
(58) Field of Classification Search ............. 312/223.2, 312/258, 265.1–265.4; 220/4.28, 6, 666; 361/679, 724–727; 52/79.5, 71, 646; 135/150, 135/151–154
See application file for complete search history.

(56) References Cited

U.S. PATENT DOCUMENTS

| 475,013 | A | * | 5/1892 | Hanley | 312/6 |
| 1,066,884 | A | * | 7/1913 | Burdick | 607/91 |
| 1,843,312 | A | * | 2/1932 | Ames | 135/154 |
| 2,638,399 | A | * | 5/1953 | Seymour | 312/297 |
| 3,656,255 | A | * | 4/1972 | Rosenfeld | 446/125 |
| 5,593,046 | A | * | 1/1997 | Katsuura et al. | 211/41.15 |
| 5,845,977 | A | * | 12/1998 | Neukam et al. | 312/223.2 |
| 5,927,025 | A | * | 7/1999 | Brockman et al. | 52/173.2 |
| 6,137,678 | A | * | 10/2000 | Gebara et al. | 361/679.31 |
| 6,766,623 | B1 | * | 7/2004 | Kalnay | 52/641 |
| 6,814,415 | B2 | * | 11/2004 | Chen | 312/223.2 |
| 6,961,236 | B1 | | 11/2005 | Chao | 361/752 |
| 7,248,464 | B1 | * | 7/2007 | Chiang | 361/679.55 |
| 2002/0078989 | A1 | | 6/2002 | Zheng | 135/125 |
| 2004/0201333 | A1 | * | 10/2004 | Chen | 312/223.2 |
| 2004/0201335 | A1 | * | 10/2004 | Davis | 312/265.3 |
| 2005/0040740 | A1 | * | 2/2005 | Yun | 312/223.2 |
| 2006/0181184 | A1 | * | 8/2006 | Klus | 312/409 |

FOREIGN PATENT DOCUMENTS

| TW | 474423 | 1/1989 |
| TW | 490120 | 8/1990 |
| TW | 531142 | 12/1991 |

* cited by examiner

*Primary Examiner*—Janet M Wilkens
*Assistant Examiner*—Dan Rohrhoff

(57) ABSTRACT

A foldable host unit case for a computer with dual crossover pivotal mechanisms includes a first module body and a second module body. The first module body and the second module body pivotally connect with each other at the middles thereof. The first module body has a foldable front wall and the second module body has a foldable rear wall. The first module body and the second module body can extend toward both lateral sides thereof respectively with respect to a rotational center formed with a pivotal shaft and the front wall and the rear wall are bent to form a firm structure. Hence, the host unit case is capable of being extended conveniently and quickly and being folded conveniently to reduce the volume thereof during being packaged.

9 Claims, 5 Drawing Sheets

FOLDABLE HOST UNIT CASE FOR A COMPUTER WITH DUAL CROSSOVER PIVOTAL MECHANISMS

BACKGROUND OF THE INVENTION

1. Field of the Invention

The present invention is related to a host unit case of a personal computer and particularly to a built-up type host unit case of a computer.

2. Brief Description of Related Art

The host unit case is employed to receive electronic devices such as a main board, hard disks, optical disk drives, floppy disk drives and power supply device. Usually, the host unit case is set up with an unchangeable structure. The composite type host unit case has such as U.S. Pat. No. 6,961,236, which discloses a computer chassis, and Taiwan patent publication No. M258544, which discloses a host unit case accommodating ATX and BTX specifications.

Following prior art is belonged to a further type for the host unit case is made available for being disassembled into several parts before being set up as the host unit case. Taiwan Patent Publication Nos. 468811 discloses a host unit case for an industrial computer. Taiwan Patent Publication No. 490120 discloses a composite computer chassis. Taiwan Patent Publication No. 474423 discloses a computer chassis free from aid of hand tools. Taiwan Patent Publication No. 490120 discloses a composite type computer chassis. Taiwan Patent Publication No. 531142 discloses a composite type computer chassis assembly.

Further, the computer chassis free from aid of hand tools disclosed in Taiwan Patent Publication No. 474423 provides the front and rear cover plates, which are pivotally joined to a bottom plate with head pins, two frame plates for a big floppy disk drive, which are pivotally joined to the front and rear cover plates, and a cover plate for a small floppy disk drive is assembled to a frame plate and is fixedly hung to the bottom of frame plate for the big floppy disk drive. Further, four L shaped plates are fixed at four corners of the bottom plate to be joined to the two cover plates firmly. Finally, two lateral cover plates are hooked to the lateral sides of the preceding structure and fastened with set screws after the main board and the power supply frame being mounted to the preceding structure to complete the whole assembly of the computer chassis. The parts of the computer chassis are packaged separately such that less space is required for storage.

However, parts of the preceding prior art are so many and divided into several part groups and it is inconvenient to pick right parts during setting up the computer chassis such that it is hard to gather the parts before assembling and it takes a lot of time to set up the computer chassis.

SUMMARY OF THE INVENTION

The crux of the present invention is to develop a host unit case, which is capable of being folded and set up more conveniently for being favorable for reduction of delivery cost and economy of storage space.

The primary object of the present invention is to provide a foldable host unit case for a computer with dual crossover pivotal mechanisms with which the host unit case can be set up completely, easily and quickly to enhance fun while the host unit case being set up by the user.

Another object of the present invention is to provide a foldable host unit case for a computer with dual crossover pivotal mechanisms with which the parts can be gathered together and reduced to a small volume while being packaged such that it is capable of lowering delivery cost and saving storage space.

Accordingly, A foldable host unit case for a computer with dual crossover pivotal mechanisms with which a reduced volume of the host unit case is obtained while being folded packaged and convenience and quickness are reached while being set up as a firm structure, comprising:

a main framework, which further comprises:

a first module body, being a metal plate capable of being bent, providing a front wall, a first upper frame edge and a first lower frame edge, and providing first folding lines for the front wall being bent;

a second module body, being a metal plate capable of being bent, providing a rear wall, a second upper frame edge and a second lower frame edge, and providing second folding lines for the rear wall being bent;

wherein, the first upper frame edge and the first lower frame edge pivotally connect with the second upper frame edge and the second lower frame edge such that the first module body and the second module body are capable of extending toward both lateral sides thereof respectively with respect a rotational center formed with a pivotal shaft and the front wall and the rear wall are bent to a front side and a rear side of the main framework respectively to constitute a firm structure;

whereby, the host unit case is capable of being set up conveniently and quickly and being folded conveniently for reducing the volume of the host unit case during being packaged.

BRIEF DESCRIPTION OF THE DRAWINGS

The present invention can be more fully understood by reference to the following description and accompanying drawings, in which.

DETAILED DESCRIPTION OF THE INVENTION

Figure 1:
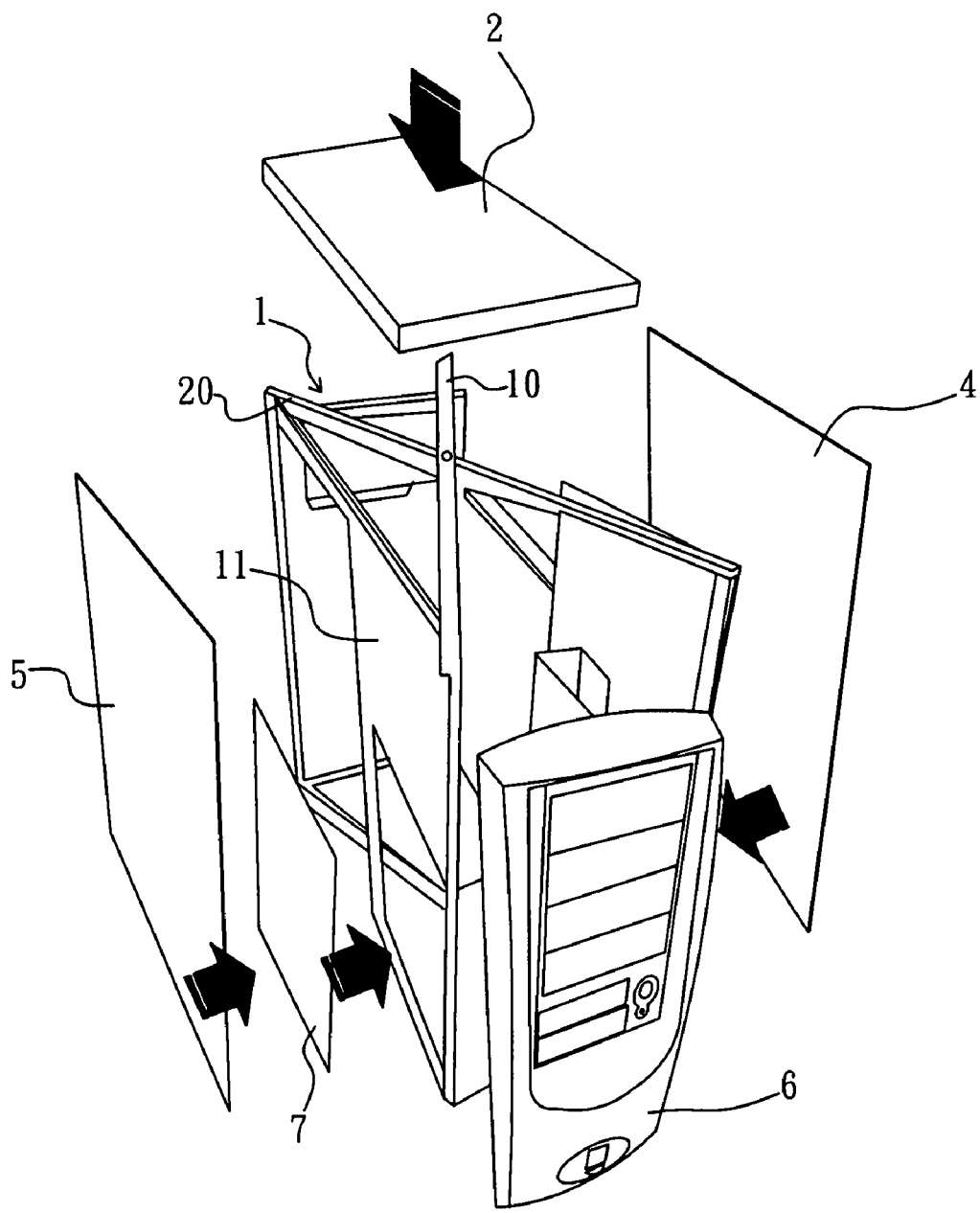
FIG. 1 is an exploded perspective view of an embodiment of a foldable host unit case for a computer with dual crossover pivotal mechanisms joint mechanisms according to the present invention.
Figure 1:
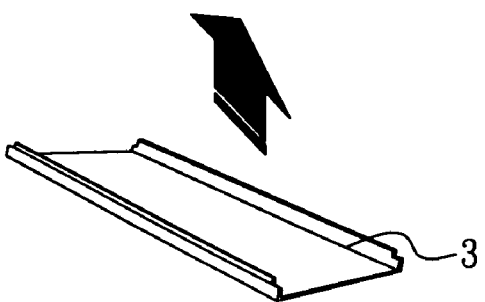
Figure 2:
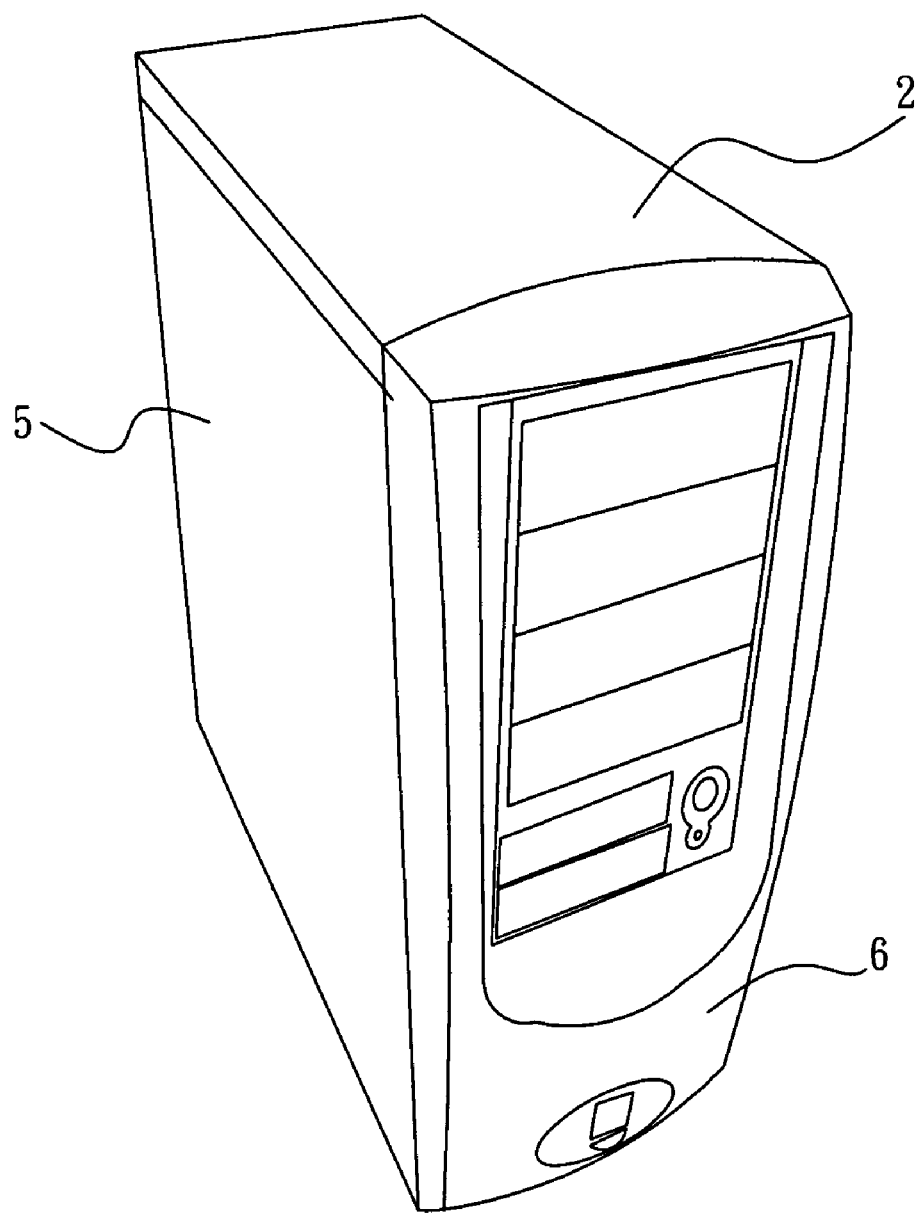
FIG. 2 is a perspective view illustrating the host unit case shown in FIG. 1 has been set up completely.

Referring to FIG. 1, the embodiment of a foldable host unit case for a computer with dual crossover pivotal mechanisms according to the present invention is capable of being reduced volume thereof for packaging and being completely set up conveniently and quickly. The host unit case in the embodiment includes a main framework 1, which is attached to an upper cover 2 and a lower cover 3 at the top and the bottom thereof respectively, a first lateral plate 4 and a second lateral plate 5 at the left side and the right side thereof respectively, and a front panel 6 at the front side thereof respectively to form a firm structure as shown in FIG. 2. The preceding parts are attached to each other by means of conventional ways such as corresponding holes provided at the preceding parts and screws passing through the corresponding holes or holes corresponding to projections provided at the preceding parts and the projections engaging with the holes.

Figure 3:
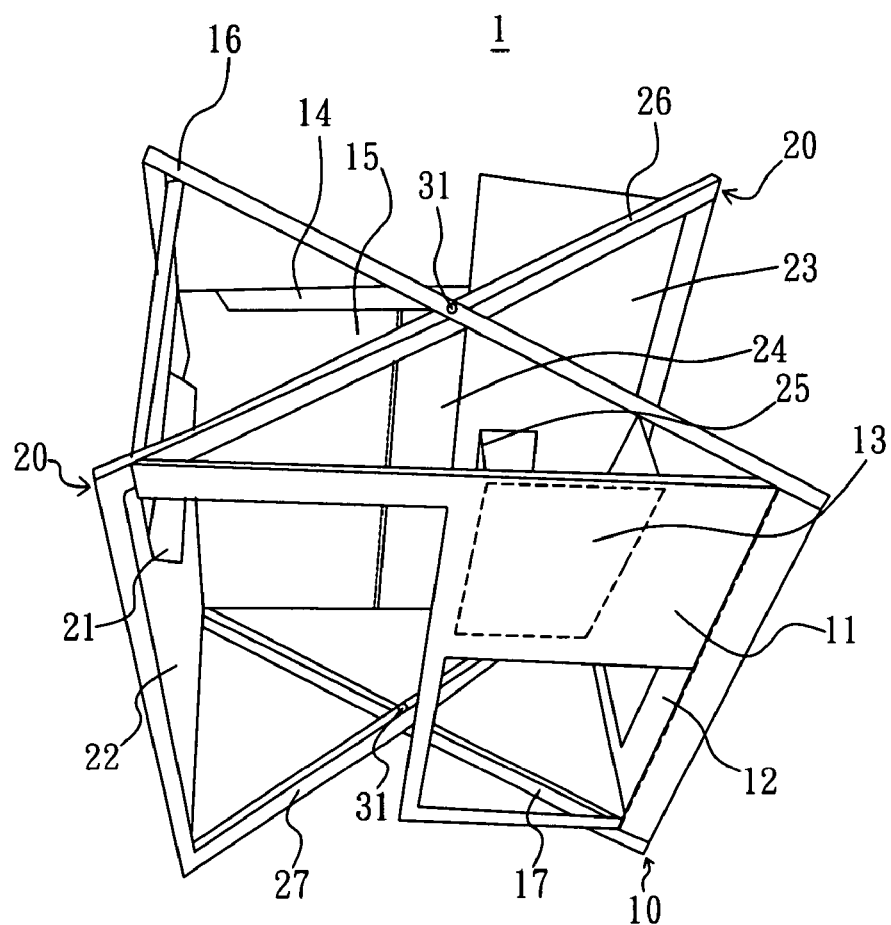
FIG. 3 is a perspective view of a main framework of the host unit in the embodiment according to the present invention.
Figure 4A:
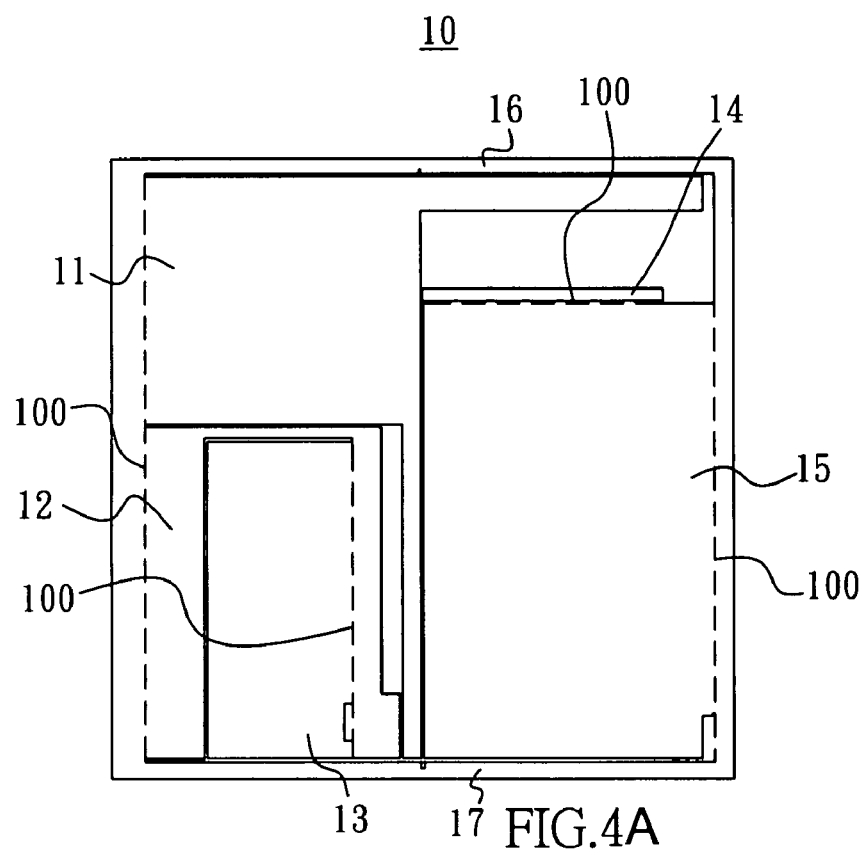
FIGS. 4A is a perspective view illustrating a first module body provided in the embodiment of the present invention before being bent to form all components.
Figure 4B:
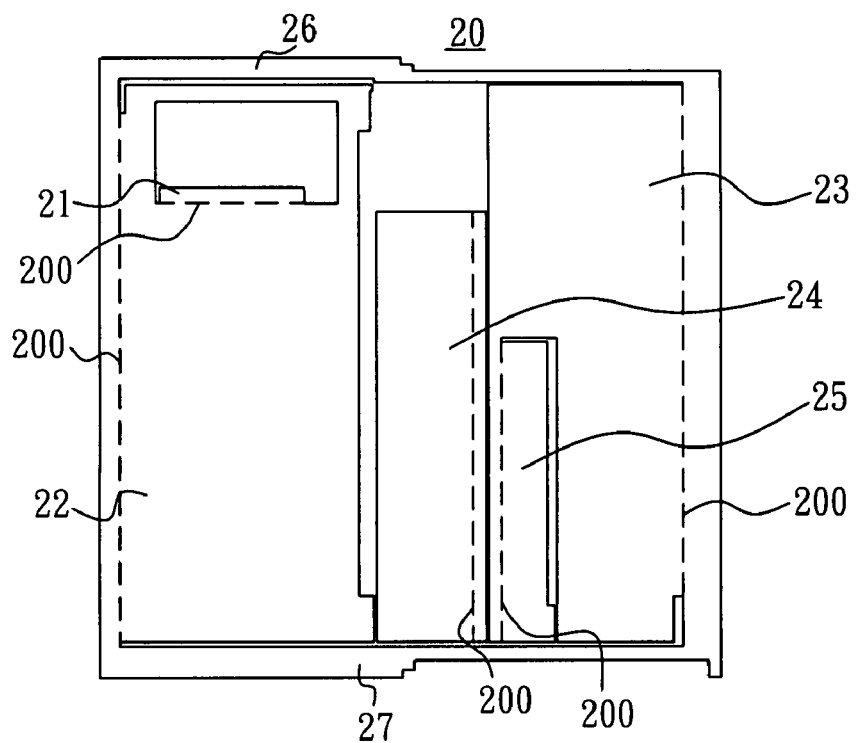
FIGS. 4B is a perspective view illustrating a second module body provided in the embodiment of the present invention before being bent to form all components.

Referring to FIGS. 3, 4A and 4B, the main framework 1 further includes a first module body 10 and a second module body 20.

The first module body 10, which is a metal sheet capable of being bent and provides a first foldable support frame 11, a front wall 12, a second foldable support frame 13, a first foldable baffle plate 14 for securing power supply, a first foldable guard wall 15 for locking the main board, a first upper frame edge 16 and a first lower frame edge 17. There are folding lines 100 between the preceding parts in the first module body 10 respectively such that the preceding parts can be formed once the first module body 10 is folded along the folding lines 100.

The second module body 20, which is a metal sheet capable of being bent and provides a second foldable baffle plate 21 for securing the power supply, a rear wall 22, a second foldable guard wall 23 corresponding to the first foldable support frame 11, a third foldable baffle plate 24 for reinforcing the first foldable guard wall 15, a fourth foldable baffle plate 25 for securing and reinforcing the second foldable support frame 13, an second upper frame edge 26 and a second lower frame edge 27. There are folding lines 200 between the preceding parts respectively in the second module body 20 such that the preceding parts can be formed once the second module body 20 is folded along the folding lines 200.

The middle spots of the first upper frame edge 16 and the first lower frame edge 17 pivotally connect with the middle spots of the second upper frame edge 26 and the second lower frame edge 27 by means of a shaft 31 respectively such that the first module body 10 and the second module body 20 are capable of rotating with respect to the shafts 31 as shown in FIG. 3.

Figure 5A:
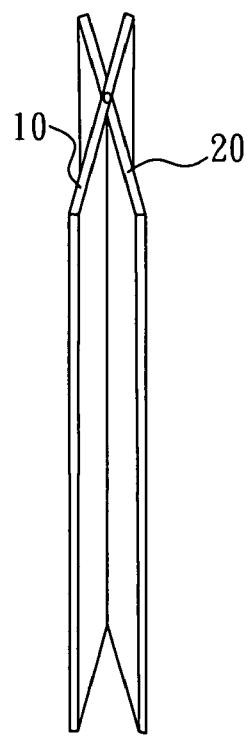
FIGS. 5A to 5C are perspective views illustrating steps for extending main framework of the host unit case in the embodiment of the present invention.
Figure 5B:
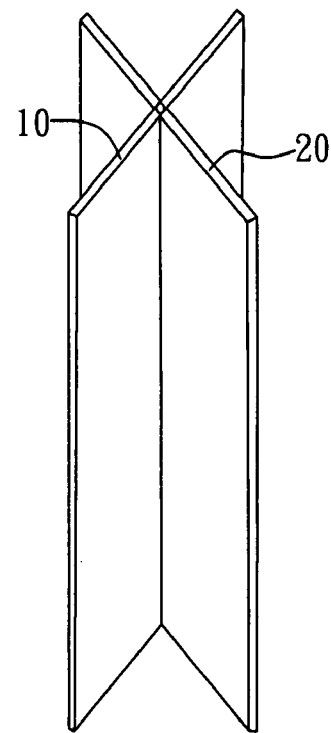
Figure 5C:
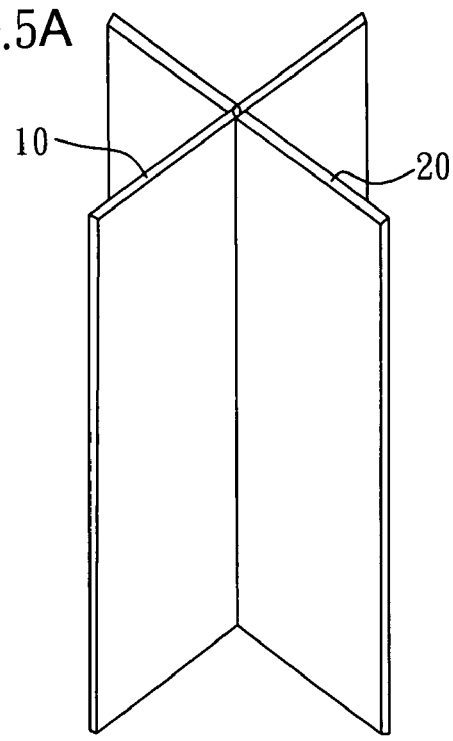

Referring to FIGS. 1, 3 and 5A to 5C, when the host unit case in the embodiment is set up, the first upper frame edge 16 and the first lower frame edge 17 of the first module body 10 pivotally connect with the upper second frame edge 26 and the second lower frame edge 27 of the second module body 20 respectively first. Then, the first module body 10 and the second module body 20 are extended a proper angular distance as shown in FIGS. 5A to 5C. Next, the first module body 10 is folded along the folding lines 100 to allow the first foldable support frame 11, the front wall 12, the second foldable support frame 13, the first foldable baffle plate 14 and the first foldable guard wall 15 being bent to proper positions. Further, the second module body 20 is folded along the folding lines 200 to allow the second foldable baffle plate 21, the rear wall 22, the second foldable guard wall 23, the third foldable baffle plate 24 and the fourth foldable baffle plate 25 being bent to proper positions. In this way, it can be seen in FIG. 3 that the front wall 12 and the rear wall 22 are disposed at the front side and the rear side of the main framework 1, the first foldable support frame 11 is disposed at a lateral side of the main framework 1, the first foldable guard wall 15 and the second foldable guard wall 23 are disposed at another lateral side of the main framework 1, the third foldable baffle plate 24 leans against the first foldable guard wall 15, the fourth foldable baffle plate 25 leans against the second foldable support frame 13, and the first foldable and second baffle plates 14, 21 are disposed horizontally as shown in FIG. 3. Finally, the upper cover 2, the lower cover 3, the left side plate 4, the right side plate 5 and the front panel 6 are attached to the main framework 1 respectively to obtain a firm structure as shown in FIG. 2.

Referring to FIGS. 1 and 3, the lower end of the first foldable support frame 11 is joined to a third support frame 7 as shown in FIG. 1. A first type electronic device such as 5.25" disk drive is placed between the first foldable support frame 11 and the second foldable guard wall 23 and a second type electronic device such as 3.25" disk drive is placed between the second foldable support frame 13 and the third support frame 7.

It is appreciated that the foldable host unit case for a computer with dual crossover pivotal mechanisms according to the present invention is capable of being set up completely, easily and quickly to enhance fun with self setting up the host unit case. In addition, all the parts in the host unit case pivotally connect with other and are capable being bent such that the host unit case can be folded as a reduced volume during being packaged and it is favorable for decreasing delivery cost and saving available storage space.

While the invention has been described with referencing to a preferred embodiment thereof, it is to be understood that modifications or variations may be easily made without departing from the spirit of this invention, which is defined by the appended claims.

What is claimed is:

1. A foldable host unit case for a computer with dual crossover pivotal mechanisms with which a reduced volume of the host unit case is obtained while being folded, comprising:
    a main framework, which further comprises:
    a first module body, being a bendable metal plate, providing a bent front wall, a first upper frame edge and a first lower frame edge;
    a second module body, being a bendable metal plate, providing a bent rear wall, a second upper frame edge and a second lower frame edge;
    wherein, the first upper frame edge is pivotally connected to the second upper frame edge via an upper pivot shaft and the first lower frame edge is pivotally connected to the second lower frame edge via a lower pivot shaft such that the first module body and the second module body are configured to unfold by selectively laterally extending with respect to a rotational center formed by the upper pivot shaft being both aligned with and overlying the lower pivot shaft, and the front wall and the rear wall are bent to a front side and a rear side of the main framework respectively to constitute a firm structure.

2. The foldable host unit case for a computer with dual crossover pivotal mechanisms as defined in claim 1, wherein the first module body has a first foldable guard wall for locking a main board and the second module body has a third foldable baffle plate for reinforcing the first foldable guard wall.

3. The foldable host unit case for a computer with dual crossover pivotal mechanisms as defined in claim 2, wherein the first module body has a first foldable support frame and the second module body has a second foldable guard wall corresponding to the first foldable support frame.

4. The foldable host unit case for a computer with dual crossover pivotal mechanisms as defined in claim 3, wherein the first module body has a second foldable support frame and the second module body has a fourth foldable baffle plate for reinforcing the second foldable support frame.

5. The foldable host unit case for a computer with dual crossover pivotal mechanisms as defined in claim 4, wherein a lower end of the first foldable support frame is joined to a third support frame for a first type electronic device being attached between the first foldable support frame and the second foldable guard wall and a second type electronic device is attached between the second foldable support frame and the third support frame.

6. The foldable host unit case for a computer with dual crossover pivotal mechanisms as defined in claim 5, wherein the first module body has a first foldable baffle plate for securing a power supply and the second module body has a second foldable baffle plate for securing the power supply.

7. The foldable host unit case for a computer with dual crossover pivotal mechanisms as defined in claim 6, wherein a top and a bottom of the main framework is attached to an upper cover and a lower cover respectively.

8. The foldable host unit case for a computer with dual crossover pivotal mechanisms as defined in claim 7, wherein a left lateral side and a right lateral side of the main framework is joined a first lateral plate and a second lateral plate respectively.

9. The foldable host unit case for a computer with dual crossover pivotal mechanisms as defined in claim 8, wherein the front side of the main framework is attached to a front panel.

\* \* \* \* \*